United States Patent
Basker et al.

(10) Patent No.: US 9,508,725 B2
(45) Date of Patent: Nov. 29, 2016

(54) TRENCH TO TRENCH FIN SHORT MITIGATION

(71) Applicant: INTERNATIONAL BUSINESS MACHINES CORPORATION, Armonk, NY (US)

(72) Inventors: Veeraraghavan S. Basker, Schenectady, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/667,800

(22) Filed: Mar. 25, 2015

(65) Prior Publication Data

US 2016/0284709 A1    Sep. 29, 2016

(51) Int. Cl.
| H01L 21/8244 | (2006.01) |
| H01L 21/20 | (2006.01) |
| H01L 27/108 | (2006.01) |
| H01L 29/94 | (2006.01) |

(52) U.S. Cl.
CPC ... *H01L 27/10867* (2013.01); *H01L 27/10826* (2013.01); *H01L 27/10832* (2013.01); *H01L 27/10879* (2013.01)

(58) Field of Classification Search
CPC .............. H01L 27/10867; H01L 27/10879; H01L 27/10826; H01L 27/10832
USPC ........................... 257/300, 301; 438/243, 386
See application file for complete search history.

(56) References Cited

U.S. PATENT DOCUMENTS

| 7,939,876 | B2 | 5/2011 | Cheng et al. |
| 8,575,670 | B2 | 11/2013 | Cheng et al. |
| 8,673,729 | B1 | 3/2014 | Basker et al. |
| 8,987,800 | B2 | 3/2015 | Chan et al. |
| 2005/0062089 | A1* | 3/2005 | Lee .................. H01L 27/10829 257/301 |
| 2009/0184356 | A1 | 7/2009 | Brodsky et al. |
| 2009/0256185 | A1* | 10/2009 | Cheng .................. H01L 21/84 257/301 |
| 2011/0248326 | A1* | 10/2011 | Kanakasabapathy et al. .................. H01L 21/845 257/300 |
| 2013/0320422 | A1 | 12/2013 | Chang et al. |
| 2014/0027831 | A1 | 1/2014 | Basker et al. |
| 2014/0030864 | A1* | 1/2014 | Basker .............. H01L 27/10867 438/386 |
| 2015/0162337 | A1 | 6/2015 | Cheng |
| 2016/0181252 | A1 | 6/2016 | Arnold |

OTHER PUBLICATIONS

Anonymous, "Trench DRAM with FinFET/nanowire access transistor and method of formation", IP.com No. IPCOM000231566D, Oct. 7, 2013.

* cited by examiner

Primary Examiner — Long K Tran
(74) Attorney, Agent, or Firm — Matthew C. Zehrer

(57) ABSTRACT

A semiconductor structure includes a replacement strap for a finFET fin that provides communication between a storage capacitor and the fin. The storage capacitor is located in a deep trench formed in a substrate and the fin is formed on a surface of the substrate. The replacement strap allows for electrical connection of the fin to the storage capacitor and is in direct physical communication with the fin and the storage capacitor. The replacement strap may be formed by removing a sacrificial strap and merging epitaxially grown material from the fin and epitaxially grown material from the capacitor. The epitaxially grown material grown from the fin grows at a slower rate relative to the epitaxially grown material grown from the capacitor. By removing the sacrificial strap prior to forming the replacement strap, epitaxial overgrowth that may cause shorts between adjacent capacitors is limited.

14 Claims, 9 Drawing Sheets

US 9,508,725 B2

TRENCH TO TRENCH FIN SHORT MITIGATION

FIELD

Embodiments of invention generally relate to semiconductor devices and semiconductor device fabrication methods. More particularly, embodiments relate to semiconductor memory structures (e.g., eDRAM, etc.) including deep trenches and mitigating trench to trench shorts.

BACKGROUND

A complementary metal oxide semiconductor (CMOS) device uses symmetrically-oriented pairs of p-type and n-type metal oxide semiconductor field effect transistors (MOSFETs) arranged on silicon or silicon-on-insulator (SOI) substrates. Source and drain regions associated with the MOSFET are connected by a channel. A gate disposed over the channel controls the flow of current between the source and drain regions. The source region, channel, and drain region may be defined by a fin that provides more than one surface through which the gate controls the flow of current, thereby making the MOSFET a "finFET" device.

Dynamic random access memory (DRAM) employs memory cells having a finFET (or other type of transistor) and a storage capacitor arranged in series. Embedded DRAM (eDRAM) embeds these memory cells into the same semiconducting material that contains a microprocessor, which allows for wider buses and faster operating speeds (as compared to DRAM) in an integrated circuit (IC) chip. Many of these embedded memory cells comprising finFETs and storage capacitors can be arranged on a single chip or within a single package to define an array.

SUMMARY

In an embodiment of the present invention, a semiconductor device fabrication process includes forming a fin layer upon a semiconductor substrate, forming a deep trench within the fin layer and within the substrate, forming a capacitor within the deep trench, forming sacrificial strap material upon the capacitor within the deep trench, forming a fin by removing portions of the fin layer, forming a sacrificial strap by removing portions of the sacrificial strap material, the sacrificial strap contacting the fin and contacting the capacitor, removing the sacrificial strap, and forming a replacement strap by merging material epitaxially grown from the fins and from the capacitor.

In yet another embodiment, a semiconductor device includes a finFET fin upon a substrate, a deep trench within the substrate, a capacitor within the deep trench, and a replacement strap in contact with the fin and with the capacitor.

In yet another embodiment, an eDRAM semiconductor device fabrication process includes forming a fin layer upon a semiconductor substrate, forming a plurality of deep trenches within the fin layer and within the substrate, forming a plurality of capacitors within the plurality of deep trench, forming sacrificial strap material upon the plurality of capacitors, forming a plurality of fins by removing portions of the fin layer, forming a plurality of sacrificial straps by removing portions of the sacrificial strap material, each respective sacrificial strap contacting a fin and contacting a capacitor, forming a plurality of gates upon the substrate and upon the plurality of fins, removing the plurality of sacrificial straps, and forming a replacement strap by merging material epitaxially grown from the plurality of fins and from the plurality of capacitors, wherein material is epitaxially grown from the upper surface of each of the plurality of capacitors and wherein the upper surfaces of each of the plurality of capacitors are lower relative to epitaxially growth seed surfaces of the plurality of fins.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Figure 1A:
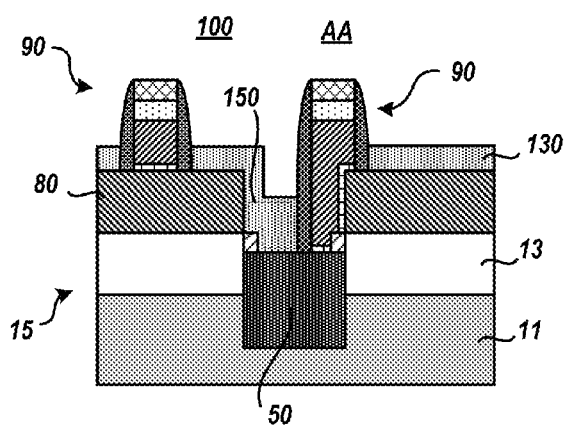
FIG. 1A depicts a cross section view and FIG. 1B depicts a top view of a semiconductor structure at an intermediate stage of semiconductor device fabrication, in accordance with various embodiments of the present invention.

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Referring to the drawings, wherein like components are labeled with like numerals, exemplary fabrication steps of forming a semiconductor structure 100 in accordance with embodiments of the present invention are shown, and will now be described in greater detail below. It should be noted that the drawings may depict cross section views of structure 100 along fin center plane AA. Furthermore, it should be noted that while this description may refer to some components of the structure 100 in the singular tense, more than one component may be included within the semiconductor device. The specific components depicted in the drawings and the cross section orientation was chosen to best illustrate the various embodiments described herein.

Figure 1B:
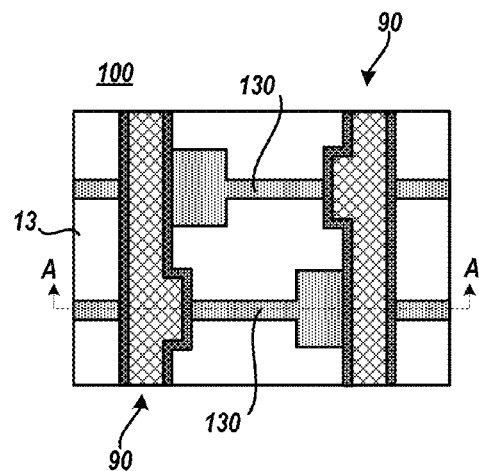

FIG. 1A and FIG. 1B depicts a semiconductor structure 100 which includes an eDRAM strap 150 connection structure for a finFET that provides communication between a storage capacitor 50 and a first end of a fin 80 of the finFET. The storage capacitor 50 is located in a deep trench formed in a substrate 15, and the fin 80 is formed on a surface of the substrate. As is known by those of skill in the art, a deep trench is one in which the depth from an upper edge of the trench to a bottom of the trench is about 5 micrometers (um) or greater.

The eDRAM strap 150 allows for electrical connection of the fin 80 to the storage capacitor 50 in the deep trench. The strap 150 is in direct physical communication with a sidewall of the fin 80 and the storage capacitor 50 and may be formed by exposing the capacitor 50 by removing a sacrificial strap and epitaxially growing material 130 from fin 80 seed surface(s) and epitaxially growing material 130 from capacitor 50 seed surfaces(s). The epitaxially grown material 130 grown from fin 80 surfaces merges with the epitaxially grown material 130 grown from capacitor 50 and forms strap 150. By removing the sacrificial strap prior to strap 150 formation, epitaxial overgrowth that may cause shorts between adjacent trenches is limited.

The storage capacitor 50 is disposed in a deep trench formed in a buried oxide layer 13 as well as in any underlying bulk substrate 11 material of a substrate 15. The fin 80 is formed from an SOI material at an upper surface of the substrate 15. Communication between the storage capacitor 50 and the fin 80 is effected through the strap 150.

Figure 2:
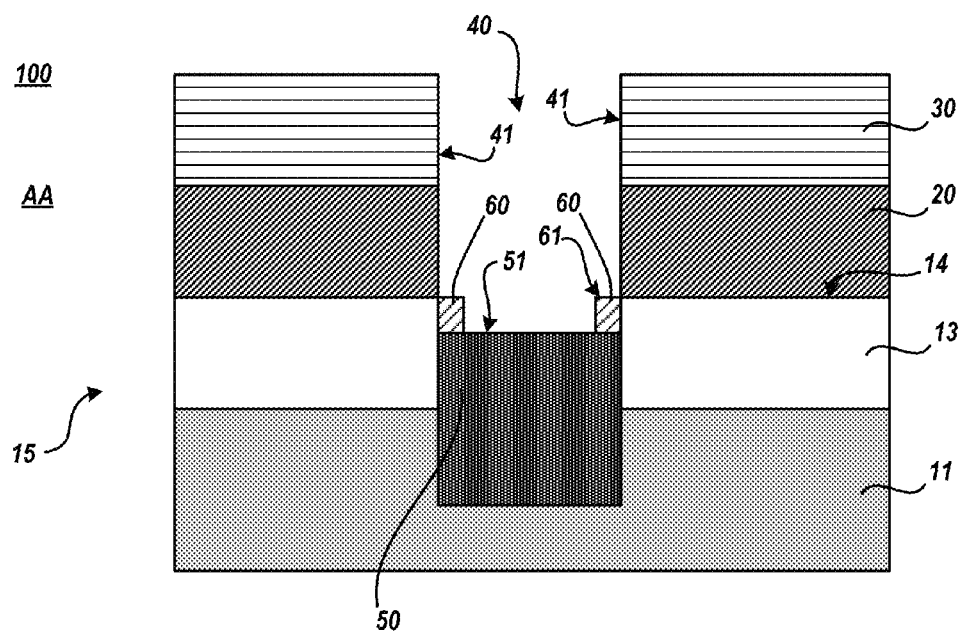
FIG. 2-FIG. 4 depict cross section views of a semiconductor structure at an intermediate stages of semiconductor device fabrication, in accordance with various embodiments of the present invention.

FIG. 2 depicts a cross section view, along plane AA, of semiconductor structure 100 at an intermediate stage of semiconductor device fabrication, in accordance with various embodiments of the present invention. At this stage of fabrication, structure 100 may include a semiconductor substrate 15, fin layer 20, mask 30, trench 40, capacitor 50, and/or spacer 60.

Substrate 15 may be, for example, a layered substrate such as a silicon-on-insulator (SOI), a SiGe-on-insulator (SGOI) or III-V on insulator substrate. Substrate 15 may include a bulk substrate 11 and a buried dielectric layer 13 formed on top of the bulk substrate 11. A blanket fin layer 20 may be formed on top of the buried dielectric layer 13. The buried dielectric layer 13 may electrically isolate the fin layer 20 from the bulk substrate 11.

The bulk substrate 11 may be made from any of several known semiconductor materials such as, for example, silicon, germanium, silicon-germanium alloy, silicon carbide, silicon-germanium carbide alloy, or other similar semiconductor materials. Non-limiting examples of compound semiconductor materials include gallium arsenide, indium arsenide, and indium phosphide. Typically the bulk substrate 11 may be about, but is not limited to, several hundred microns thick. In one embodiment, the bulk substrate 11 may have a thickness ranging from 0.5 mm to about 1.5 mm.

The buried dielectric layer 13 may include any of several dielectric materials, for example, oxides, nitrides and oxynitrides of silicon. The buried dielectric layer 13 may also include oxides, nitrides and oxynitrides of elements other than silicon. In addition, the buried dielectric layer 13 may include crystalline or non-crystalline dielectric material. Moreover, the buried dielectric layer 13 may be formed using any of several known methods, for example, thermal or plasma oxidation or nitridation methods, chemical vapor deposition methods, and physical vapor deposition methods. The buried dielectric layer 13 may have a thickness ranging from about 5 nm to about 250 nm. In one embodiment, the buried dielectric layer may have a thickness ranging from about 120 nm to about 200 nm.

The blanket fin layer 20 may include any of the several semiconductor materials included in the bulk substrate 11. In general, the bulk substrate 11 and the fin layer 20 may include either identical or different semiconducting materials with respect to chemical composition, dopant concentration and crystallographic orientation. The bulk substrate 11 and the fin layer 20 may include semiconducting materials of different crystallographic orientations. Materials of fin layer may include silicon, silicon-germanium alloys with varying amounts of germanium, III-V compound semiconductors, etc. Methods for forming the fin layer 20 are well known in the art. Non-limiting examples include SIMOX (Separation by Implantation of Oxygen), wafer bonding, ELTRAN® (Epitaxial Layer TRANsfer), chemical vapor deposition (CVD), atomic layer deposition (ALD), etc. It may be understood by a person having ordinary skill in the art that a plurality of fins 80 may be etched from the fin 20 layer. Because the fins 80 may be etched from the fin layer 20, the fins 80 may include any of the characteristics listed above for the fin layer 20. Typically, the fin layer 20 may include a thickness ranging from about 5 nm to about 100 nm. In one embodiment, the fin layer 20 may have a thickness ranging from about 25 nm to about 30 nm.

The mask layer 30 may be a blanket layer or a multilayer material that may be patterned to define deep trench 40. When the mask layer 30 is multilayered, it may include a pad oxide layer deposited upon the fin layer 20 and a pad nitride layer deposited upon the pad oxide layer. The combination of pad oxide and pad nitride layers can be etched selectively to each other and, when patterned (e.g. using a resist layer, not shown) that can be selectively exposed to energy which develops differential solubility to form a pattern), provide a hard mask for etching of the fin layer 20, the buried dielectric later 13, and the bulk substrate 11. This etching process should be substantially anisotropic (for which many suitable processes are known) to form openings, or deep trenches 40, without significant etching of the ends of layers 20 and 13 as they may be exposed. In certain embodiments, to further increase the area of the interior of the deep trenches 40, an isotropic etch, for which many suitable processes are known, may be performed within the deep trenches 40. The process of enlarging the deep trenches 40 in such a manner may be also referred to as bottling since it may form a bottle-like shape that is larger in diameter than at the opening of trench 40. Though trench 40 is depicted as polygonal shaped having multiple sidewalls 41, trench 40 may also be circularly shaped having one sidewall 41, etc.

The deep trenches 40 may be filled with conductive polysilicon forming capacitor 50. The polysilicon filling trenches 40 may be formed to a height where the upper surface 51 of capacitor 50 is coplanar with the upper surface 14 of buried dielectric layer 13. Alternatively, the polysilicon filling trenches 40 may be formed to a height where the upper surface 51 of capacitor 50 is below the upper surface 14 of buried dielectric layer 13. Additional trench processing steps may be optionally completed prior to the formation of capacitor 50. For example, the trenches 40 may be lined with an isotopically deposited high dielectric constant layer (not shown) and a conductive metal or metal nitride layer (not shown) upon the sidewall(s) 41 of trench 40.

Inner spacer 60 may be deposited upon the capacitor 50 perimeter and upon the sidewall(s) 41 of trench 40. Inner spacer 60 is formed such that an internal portion of capacitor 50 is exposed. The spacer material may include Silicon nitride (SiN), Silicon-Boron-Carbon-Nitride (SiBCN), Silicon-Oxide-Carbon-Nitride (SiOCN) and Silicon oxycarbide (SiOC). The spacer 60 may be utilized to limit epitaxial growth of material from the upper surface 51 of capacitor 50. In other words, the spacer 60 may be utilized to cover sidewalls of the buried dielectric layer 13 within trench 40 to prevent epitaxial growth from such buried dielectric layer 13 surfaces. An upper surface 61 of spacer 60 may be coplanar with the upper surface 14 of buried dielectric layer 13. Thus, spacer 60 may be utilized in those embodiments where the polysilicon filling trenches 40 may be formed to a height where the upper surface 51 of capacitor 50 is below the upper surface 14 of buried dielectric layer 13. Alternatively, the upper surface 61 of spacer 60 may be above the upper surface 14 of buried dielectric layer 13.

Figure 3:
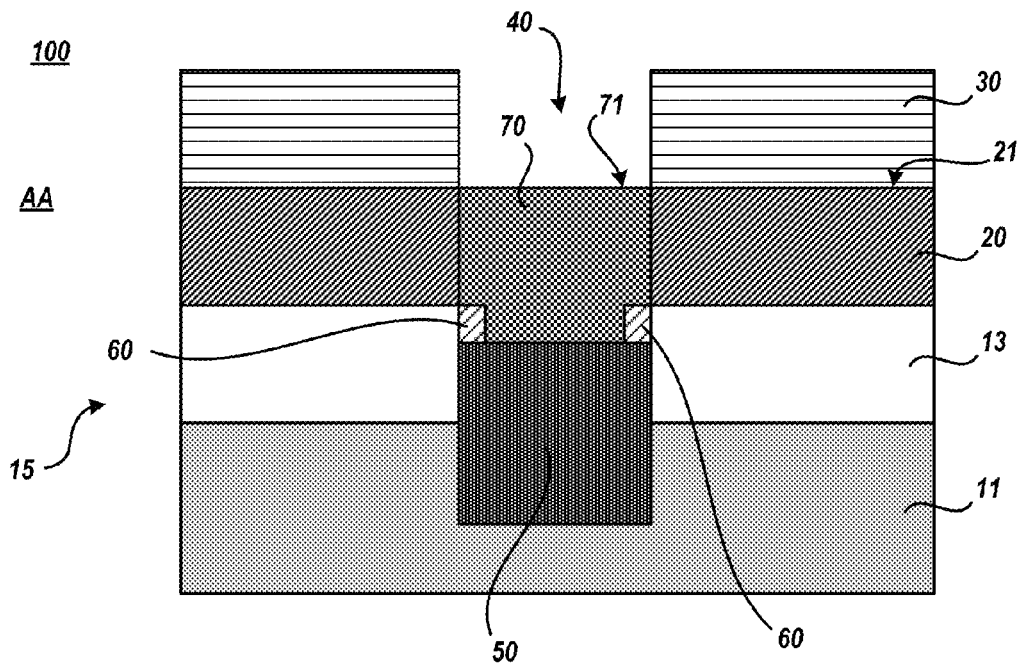

FIG. 3 depicts a cross section view, along plane AA, of semiconductor structure 100 at an intermediate stage of semiconductor device fabrication, in accordance with various embodiments of the present invention. At this stage of fabrication, sacrificial strap material 70 is deposited within trenches 40. For example, sacrificial strap material 70 may be deposited upon capacitor 50 upper surface 51 and upon sidewalls 41 of trench 41. The sacrificial strap material 70 makes a connection to the capacitor 50 and to the fin layer 20. The sacrificial strap material 70 may be removed in subsequent fabrication processes and therefore may be a material that may allow for selective removal relative to other structure 100 materials. For example, sacrificial strap material 70 may be silicon germanium (SiGe), doped SiGe, etc. The sacrificial strap material 70 may be formed to a thickness such that upper surface 71 is coplanar with an upper surface 21 of fin layer 20. Alternatively, the sacrificial strap material 70 may be formed to a thickness such that upper surface 71 is below the upper surface 21 of fin layer 20.

Figure 4:
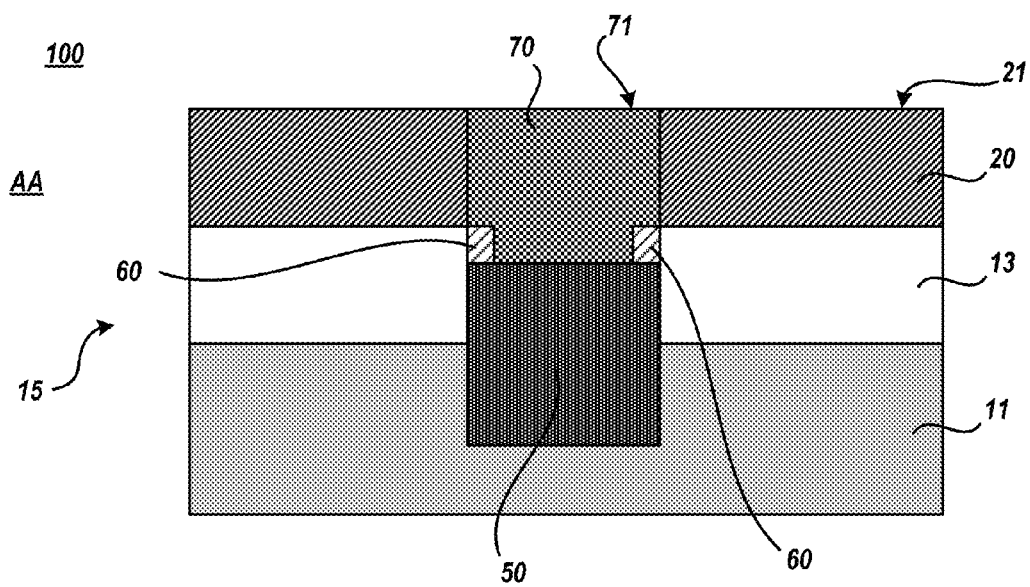

FIG. 4 depicts a cross section view, along plane AA, of semiconductor structure 100 at an intermediate stage of semiconductor device fabrication, in accordance with various embodiments of the present invention. At this stage of fabrication, mask layer 30 is removed. Mask layer 30 may be removed by using a selective etch process or any other known or later developed methods. Wet etching which has selectivity between mask layer 30 and fin layer 30 material/sacrificial strap material 70 may be used. Hydrofluoric acid (HF), buffered hydrofluoric acid (BHF) or other materials or combinations of materials may be used to remove mask layer 30. A dry etch process such as RIE may also be used.

Figure 5A:
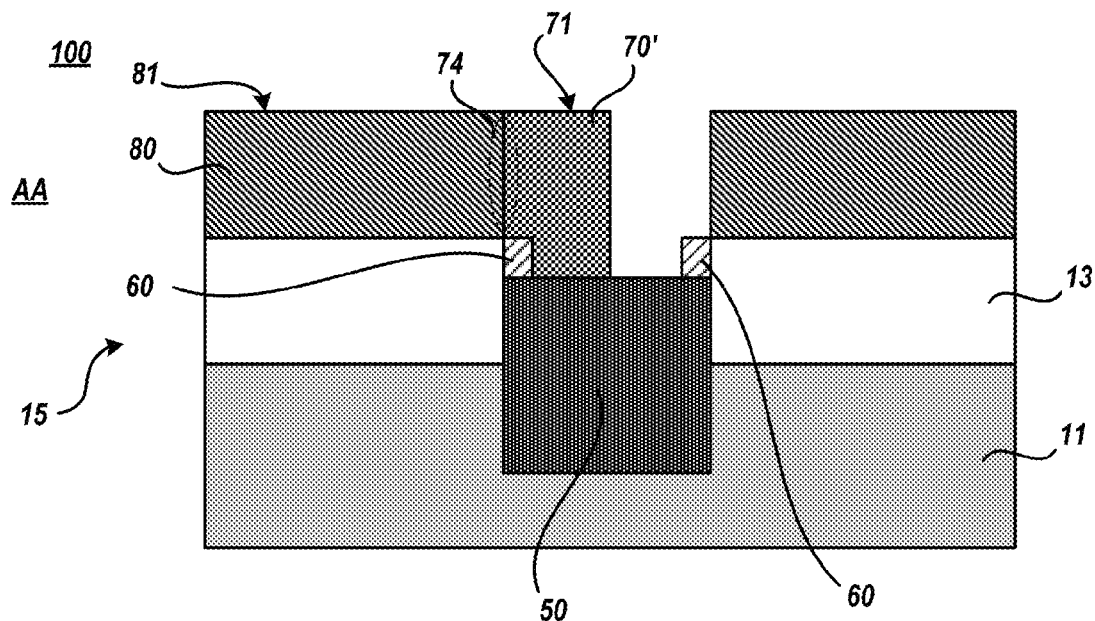
FIG. 5A depicts a cross section view and FIG. 5B depicts a top view of a semiconductor structure at an intermediate stage of semiconductor device fabrication, in accordance with various embodiments of the present invention.
Figure 5B:
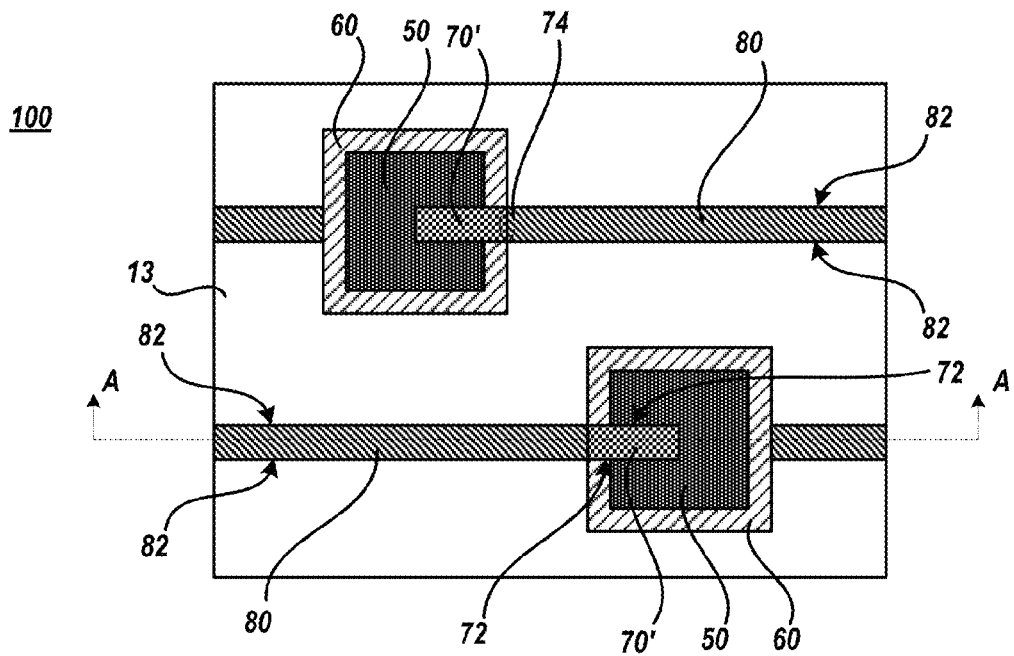

FIG. 5A depicts a cross section view, along plane AA, and FIG. 5B depicts a top view of semiconductor structure 100 at an intermediate stage of semiconductor device fabrication, in accordance with various embodiments of the present invention. At this stage of fabrication, fins 80 and sacrificial strap 70' are formed. Fins 80 may be formed by subtractive etching processes. Such processes may utilize a mask (not shown) to protect a masked portions of structure 100 within the desired fin footprints from an etchant utilized to remove non-masked portions of structure 100 outside of the desired fin footprints. The mask can be formed using process steps such as, without limitation: material deposition or formation; photolithography; imaging; etching; and cleaning. For instance, a soft mask or a hard mask can be formed overlying the protected portions to serve as the mask while non-masked material is removed by the etchant. The etchant(s) may be chosen to selectively remove the material of fin layer 20 stopping at the buried dielectric layer 13 and to remove a portion of sacrificial strap material 70 stopping at capacitor 50 & spacer 60. The retained fin layer 20 material forms fins 80 and the retained sacrificial strap material 70 forms sacrificial strap 70'. Multiple etching stages may be utilized to initially form fins 80 and subsequently form sacrificial strap 70', or vice versa. Sacrificial strap 70' is a temporary connection structure for the finFET that provides direct contact between capacitor 50 at junction 76 and the first end of fin 80 at junction 74 that may be sacrificed, or removed, in subsequent fabrication stages. The first end of fin 80 includes sidewalls 82 that are coplanar with sidewalls 72 of sacrificial strap 70'.

Figure 6A:
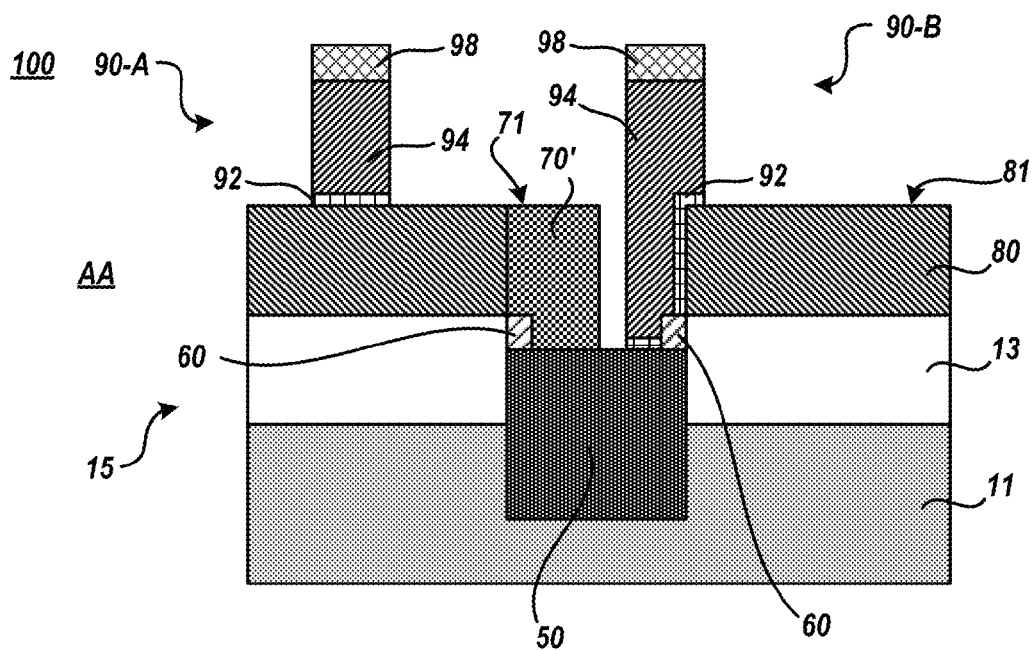
FIG. 6A depicts a cross section view and FIG. 6B depicts a top view of a semiconductor structure at an intermediate stage of semiconductor device fabrication, in accordance with various embodiments of the present invention.
Figure 6B:
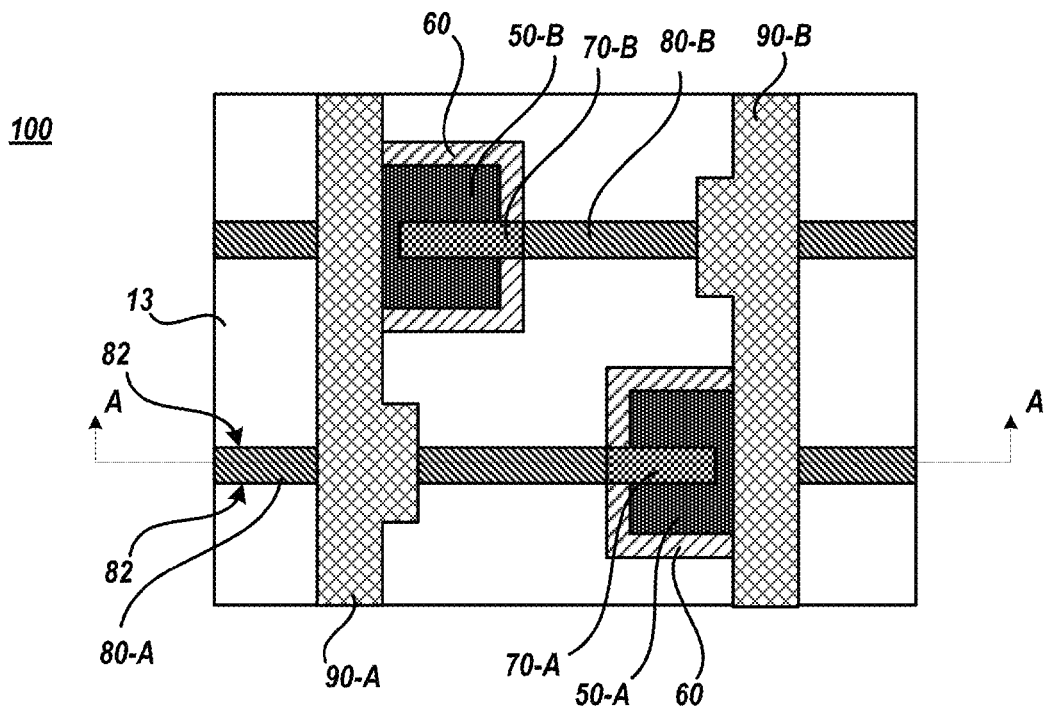

FIG. 6A depicts a cross section view, along plane AA, and FIG. 6B depicts a top view of semiconductor structure 100 at an intermediate stage of semiconductor device fabrication, in accordance with various embodiments of the present invention. At this stage of fabrication, gates 90 are formed.

Gate 90 may be formed upon substrate 15 and upon fins 80. A gate dielectric layer 92 may be deposited upon upper surface of buried dielectric layer 13 orthogonal to fin 80 and upon fin 80 surrounding a channel region of fin 80. Electrically conductive gate material 94, such as poly silicon, metal, etc. may be deposited upon gate dielectric layer 92. A gate cap 98 may be formed upon the gate material 94. The gates may be formed using either the gate-first flow or the industry standard replacement gate flow wherein the dummy polysilicon gate is replaced with a metal gate with high-k dielectric and a gate cap.

Gate dielectric layer 92 may be, e.g., a silicon oxide, a silicon oxynitride and high-k materials such as hafnium dioxide, aluminum oxide, etc. In one embodiment, the gate dielectric layer 92 can be formed by the deposition of silicon oxide by CVD, atomic layer deposition (ALD), etc. The gate dielectric layer 92 may have a thickness ranging from about 1 nm to about 10 nm, although a thickness less than 1 nm and greater than 10 nm have been contemplated. In one embodiment, the gate dielectric layer 102 may be about 5 nm thick. Gate material 94 may be formed by depositing conductive material upon gate dielectric layer 92. In various embodiments, gate material 94 may be poly silicon, metal, etc. In particular embodiments, gate material 94 may be poly silicon deposited by e.g. plasma-enhanced chemical vapor deposition (PECVD). The thickness of gate material 94 may be from 10 nm to 500 nm, although lesser and greater thicknesses have been contemplated.

In embodiments, gate 90 can be formed using subtractive etching processes. For example, a lithography step may entail applying a photoresist, exposing the photoresist to a pattern of radiation, and developing the pattern utilizing a resist developer. Following the lithography step, an etching process such as reactive-ion etching (RIE) may be employed in transferring the pattern. In certain embodiments, poly, nitride, metal or other gate cap 98 may be formed upon gate 90. In certain embodiments this cap 98 may be deposited as a masking layer and utilized as a etch mask (e.g. hard mask, etc.) associated with the formation of gates 90. Using the cap 98 as a mask, an etchant may be used to remove unprotected portions of the gate material 94 and gate dielectric 92 outside the footprint of gates 90, thereby defining the gates 90. Subsequent to lithographic and etching processes, a gate stack may be formed that, e.g., includes a retained portion of gate dielectric layer 92, a retained portion of gate material 94 upon the gate dielectric layer 92, and a retained portion of the cap 98 upon the gate material portion 94.

The structure 100 may take the form of an eDRAM finFET. A first eDRAM finFET is associated with fin 80-A, gate 90-A, and capacitor 50-A. The portion of fin 80-A underlying the gate 90-A may be the channel region of the first finFET and the portions of fin 80-A extending from either side of gate 90-A may be the source and drain regions of the first finFET, respectively. Likewise, a second eDRAM finFET is associated with fin 80-B, gate 90-B, and capacitor 50-B. The portion of fin 80-B underlying the gate 90-B may be the channel region of the second finFET and the portions of fin 80-B extending from either side of gate 90-B may be the source and drain regions of the second finFET, respectively. In certain embodiments, gates 90 may be sacrificial gates associated with gate last fabrication processes wherein portions of the gates 90 are removed and replaced in subsequent fabrication steps. In other embodiments, gates 90 are gates associated with gate first fabrication processes.

Figure 7A:
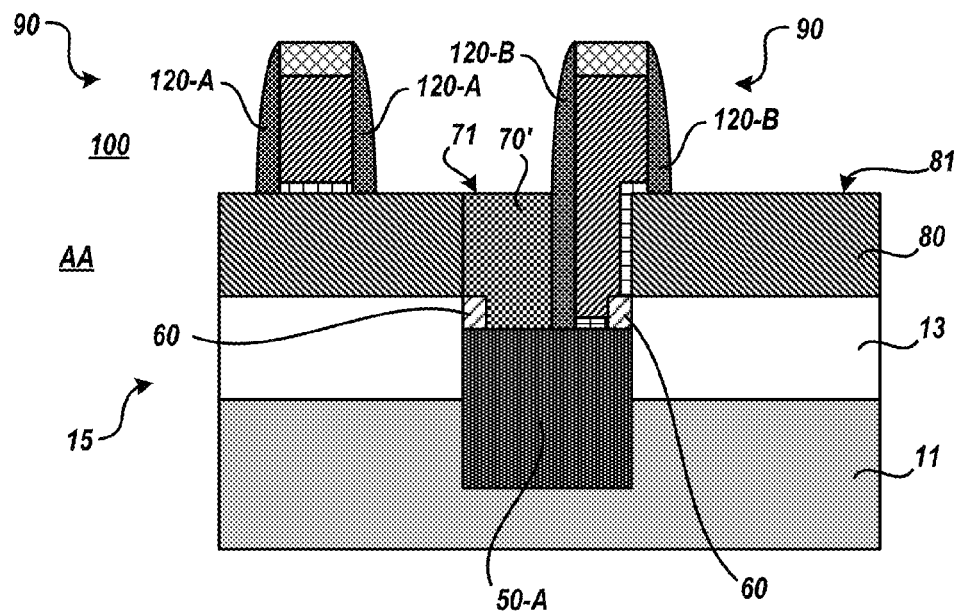
FIG. 7A depicts a cross section view and FIG. 7B depicts a top view of a semiconductor structure at an intermediate stage of semiconductor device fabrication, in accordance with various embodiments of the present invention.
Figure 7B:
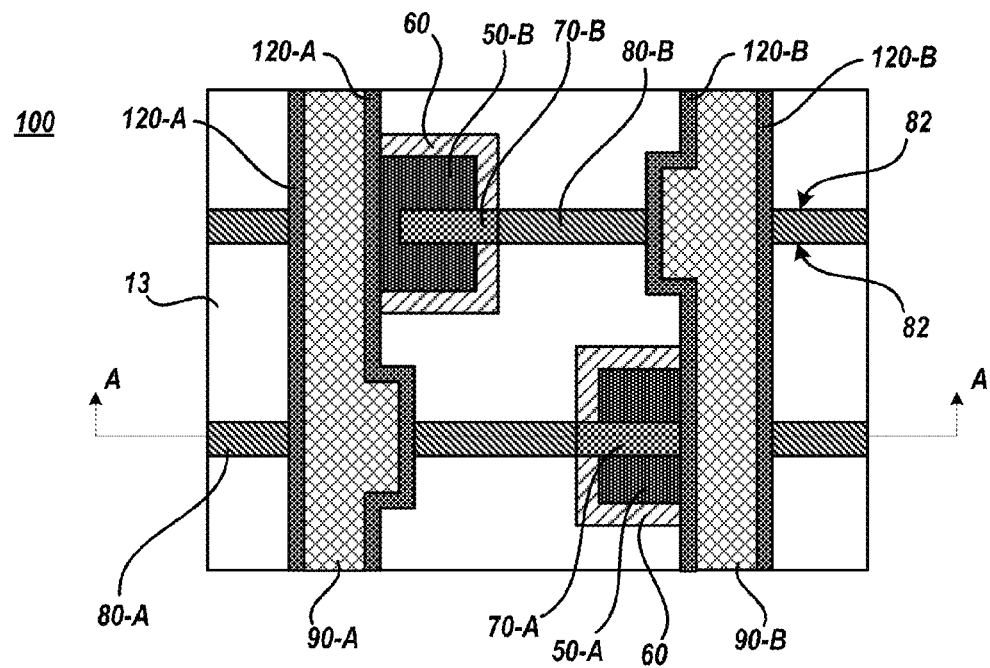

FIG. 7A depicts a cross section view, along plane AA, and FIG. 7B depicts a top view of semiconductor structure 100 at an intermediate stage of semiconductor device fabrication, in accordance with various embodiments of the present invention. At this stage of fabrication, gate spacers 120 are formed.

Gate spacers 120 may be a dielectric material, such as silicon oxide, silicon nitride, silicon oxynitride, etc. The gate spacer 120 may be formed by deposition of a spacer material and subsequent etching to remove the spacer material except from the sidewalls of the gate stacks. The width of the gate spacer 120 may be from 3 nm to 120 nm, and typically from 20 nm to 60 nm, although lesser and greater widths have been contemplated. In certain embodiments, spacers 120 are sacrificial structures formed to act as a place holder for replacement spacers formed in subsequent fabrication steps. In other embodiments, spacers 120 are maintained. Generally, the gate spacers 120 may be formed by other known or additional techniques than those described without deviating from the spirit of those embodiments herein claimed.

Following the formation of spacers 120, sacrificial strap 70' may physically connect the fin 80 to the storage capacitor 50 in the deep trench and contact the spacer 120 of the inactive gate. For example, in association with the first finFET, strap 70'-A is in direct physical contact with a sidewall of the fin 80-A, the storage capacitor 50-A, and the spacer 120-B of the second finFET. The strap 70'-A may be flush with the outer surface of the spacer 120-B or it may be tucked into the spacer 120-B. In other embodiments, the sacrificial strap 70' need not physically contact the spacer 120 of the inactive gate. For example, in association with the second finFET, strap 70'-B makes direct physical contact with a sidewall of the fin 80-B and the storage capacitor 50-B and does not physically contact the spacer 120-A of the first finFET.

Figure 8A:
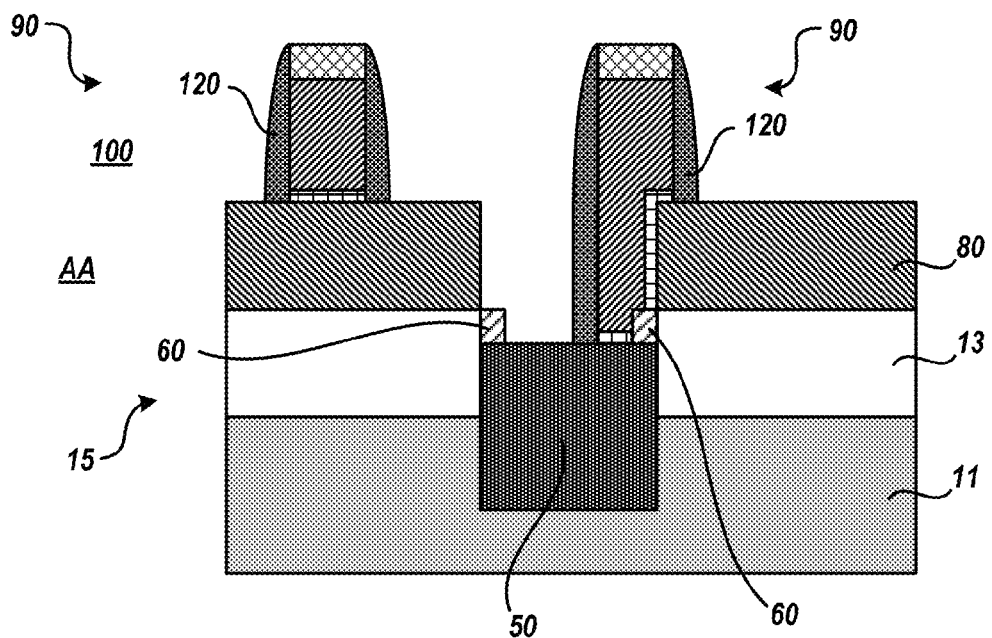
FIG. 8A depicts a cross section view and FIG. 8B depicts a top view of a semiconductor structure at an intermediate stage of semiconductor device fabrication, in accordance with various embodiments of the present invention.
Figure 8B:
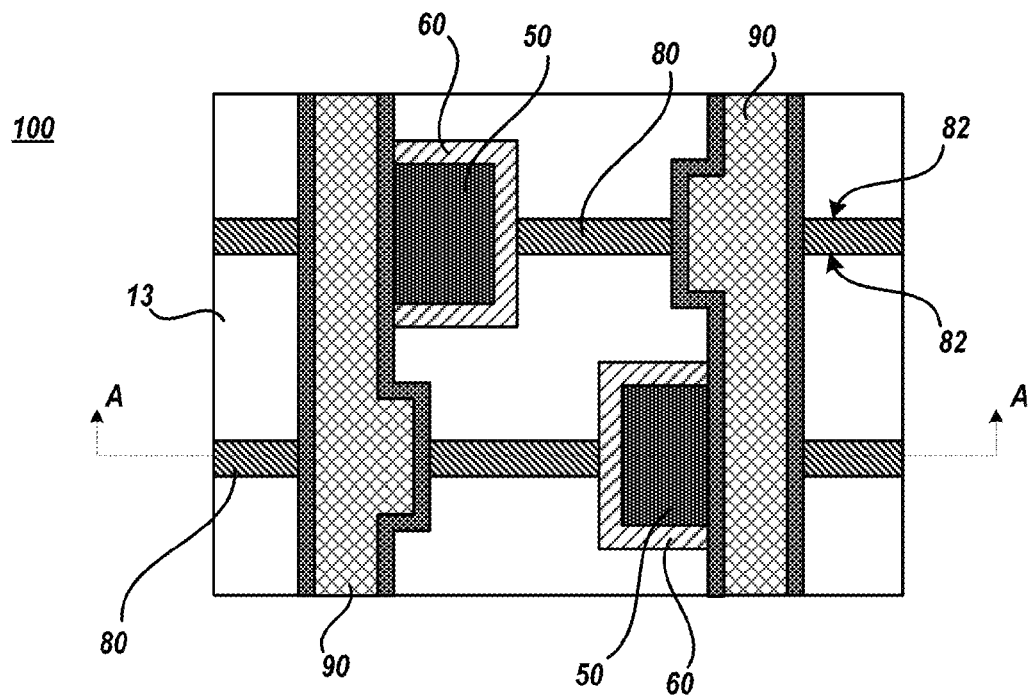

FIG. 8A depicts a cross section view, along plane AA, and FIG. 8B depicts a top view of semiconductor structure 100 at an intermediate stage of semiconductor device fabrication, in accordance with various embodiments of the present invention. At this stage of fabrication, sacrificial strap 70' is removed.

The sacrificial strap 70' may be removed using any suitable etching technique such as dry etch, wet etch, or combination of both. For example, sacrificial strap 70' can be removed using utilizing an etchant, such as hydrochloric acid, etc. In certain implementations, the etching technique may require a etch mask to be formed that resists etching to protect portions of semiconductor device 10. Following the formation of the etch mask, the sacrificial strap 70' may remove by the etchant. Following the removal of sacrificial strap 70', the etch mask may be removed. The removal of sacrificial strap 70' may be selective to the material of e.g., dielectric layer 13, fins 80, spacer 60, capacitor 50, gate cap 98, and/or gate spacer 120, etc. In other words, the etchant may be chosen to selectively remove the material of sacrificial strap 70' and to retain the materials of e.g., dielectric layer 13, fins 80, spacer 60, capacitor 50, gate cap 98, and/or gate spacer 120, etc. In certain embodiments, sacrificial strap 70' may be removed during epitaxy pre-clean processes associated with the epitaxial growth of material 130.

Figure 9A:
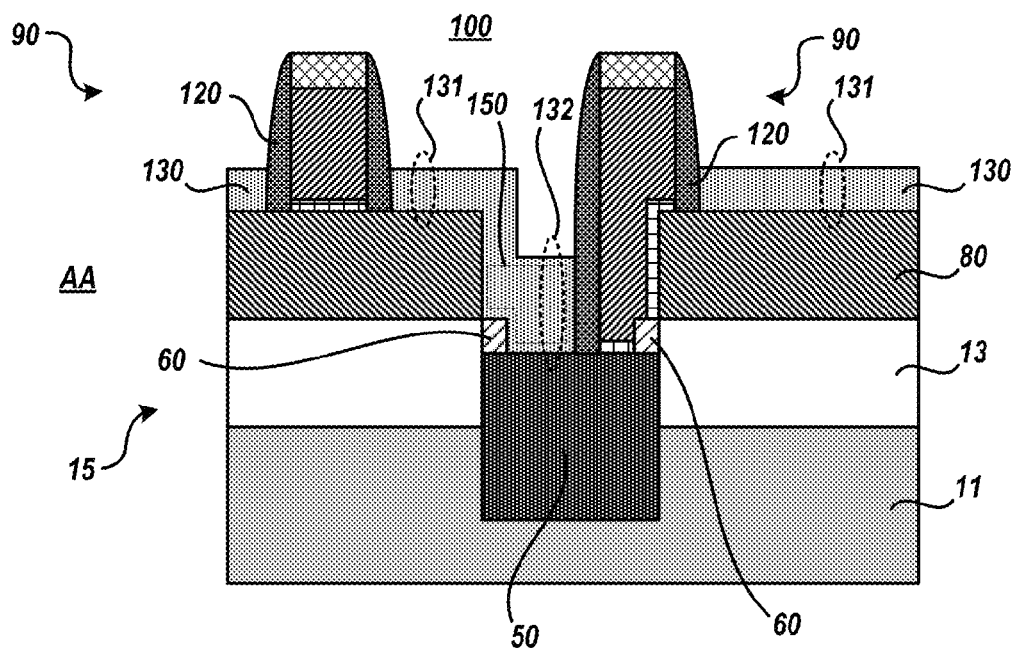
FIG. 9A depicts a cross section view and FIG. 9B depicts a top view of a semiconductor structure at an intermediate stage of semiconductor device fabrication, in accordance with various embodiments of the present invention.
Figure 9B:
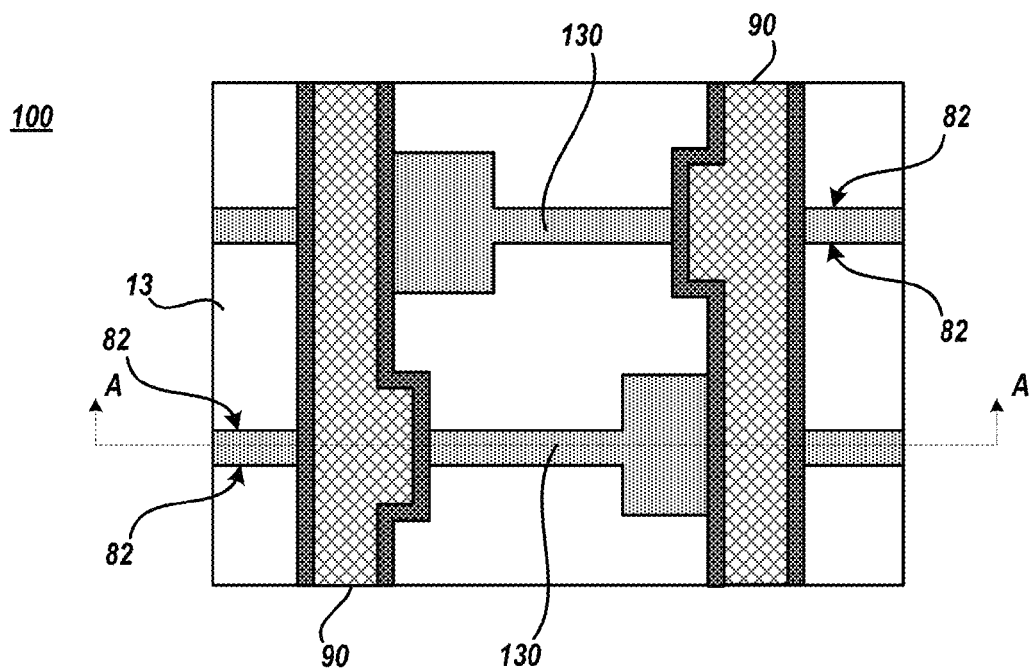

FIG. 9A depicts a cross section view, along plane AA, and FIG. 9B depicts a top view of semiconductor structure 100 at an intermediate stage of semiconductor device fabrication, in accordance with various embodiments of the present invention. At this stage of fabrication, strap 150 is formed by epitaxially growing material 130 from the fins 80 and the capacitor 50.

Epitaxial growth, grown, deposition, formation, etc. means the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> lattice place will take on a <100> orientation.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the epitaxial semiconductor material typically ranges from 550° C. to 900° C.

Epitaxially grown material 130 typically grow from polysilicon at a faster rate at higher pressures and temperatures, relative to epitaxial growth from amorphous semiconductor materials. Therefore, in embodiments, epitaxial growth of material 130 from capacitor 50 in region 132 occurs at a faster rate than epitaxial growth of material 130 from fin 80 in region 131, resulting in a thicker or more epitaxially grown material 130 in region 132 relative to epitaxially grown material 130 in region 131. During epitaxial material 130 growth, the epitaxial material 130 grown from fins 80 merges with the epitaxial material 130 grown from capacitor 50. As a result, strap 150 is formed by the merged epitaxially grown material 130 grown from fin 80 and grown from capacitor 150.

The strap 150 allows for electrical connection of the fin 80 to the storage capacitor 50. The strap 150 is in direct physical communication with the fin 80 via the epitaxially grown material 130 grown from the end sidewall of the fin 80 and is in direct physical communication with the capacitor 50 via the epitaxially grown material 130 grown from the upper surface 51 of capacitor 50. The direct physical and electrical communication between the epitaxially grown material 130 grown from the end sidewall of the fin 80 and the epitaxially grown material 130 grown from the upper surface 51 of capacitor 50 is provided by the merging of the respective epitaxially grown material 130.

The material of fins 80 and the material of capacitor 50 may serve as the seed surface for the epitaxial growth of the material 130. The epitaxy growth may be carried out in a selective manner, meaning that the epitaxial growth may occur only over exposed semiconductor surfaces, for instance, from the exposed perimeter of fins 80 and from the exposed upper surface 51 of capacitor 50, while other surfaces of structure 100 stay essentially free of the epitaxy material 130. A non-limiting list of exemplary epitaxially grown materials 130 are: silicon germanium alloy (SiGe), Silicon (Si), in-situ doped SiGe or Si, etc, the specific material 130 depending upon the underlying seed material.

For clarity, epitaxially grown material 130 may be further grown from sidewalls 82 of fins 80 thereby forming diamond shaped epitaxial material 130 upon fins 80, as is known in the art. Such diamond shaped epitaxially grown material 130 is not shown in e.g., FIG. 9B to best illustrate the epitaxial growth of material 130 from capacitor 50.

By removing the sacrificial strap 70' prior to the growth of epitaxial material 130, a strap 150 may be formed and epitaxial overgrowth that may cause shorts between adjacent capacitors 50 (i.e., capacitor 50-A and capacitor 50-B, etc.) is limited. In other words, the epitaxial growth of material 130 from capacitor 50 begins at a relatively lower seed surface 51, allowing an adequate time to appropriately form epitaxial material 130 from fins 80 while also minimizing the likelihood of epitaxial material 130 overgrowth that may physically contact, and thereby short, adjacent capacitors 50.

Though shown as a last stage of fabrication, structure 100 may undergo further fabrication steps that may add or remove materials, etc. in further front end of line, middle end of line, or back end of line fabrication steps to form a semiconductor device, such as an eDRAM device, etc.

Figure 10:
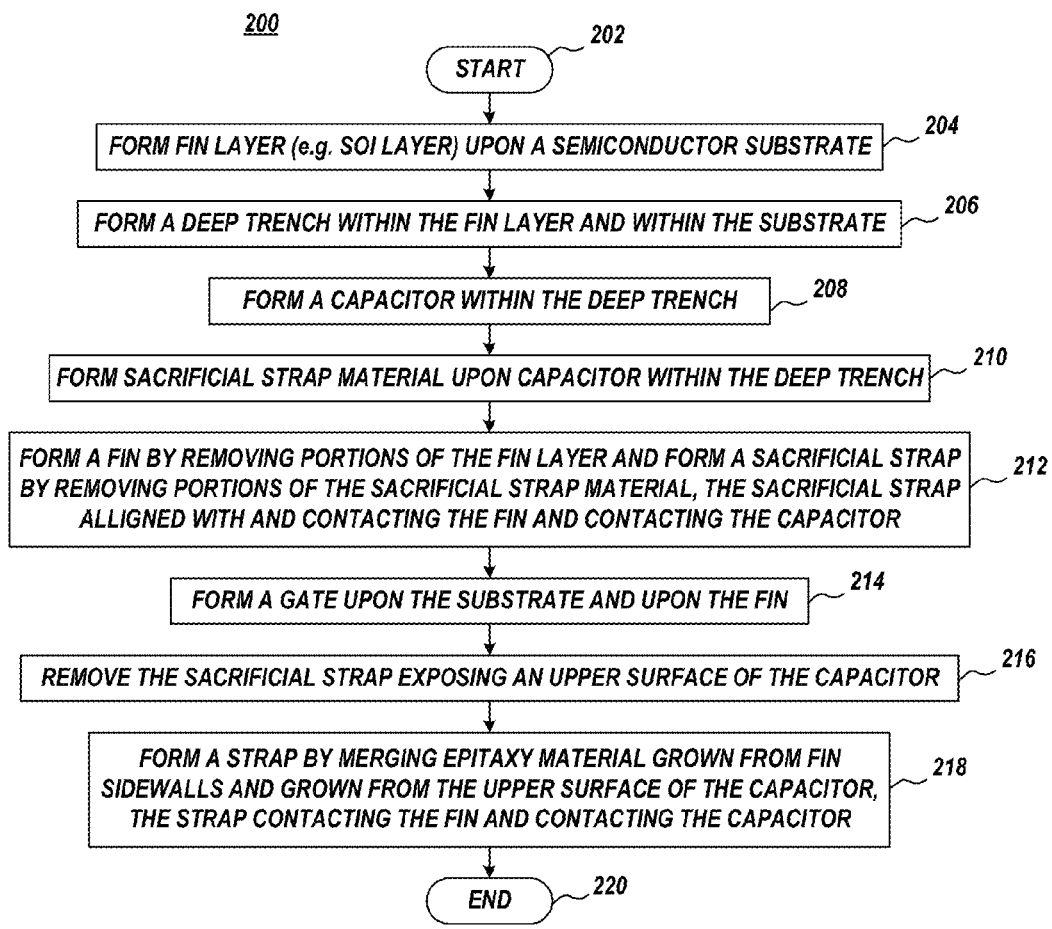
FIG. 10 depicts a semiconductor device fabrication method, in accordance with various embodiments of the present invention.

FIG. 10 depicts an exemplary process flow method 200 for fabricating a semiconductor device utilizing eDRAM, in accordance with various embodiments of the present invention. Method 200 begins at block 202 and continues by forming a fin layer upon a semiconductor substrate (block 204). For example, a fin layer 22, also known as a silicon on insulator (SOI) layer, may be deposited upon substrate 15. More particularly, the fin layer 22 may be deposited upon the buried dielectric layer 13 of substrate 15.

Method 200 may continue with forming a deep trench within the fin layer and within the substrate (block 206). For example, a mask layer 30 may be formed upon the fin layer 22 and patterned to define the footprint of the deep trench 40. A subtractive etching process removes portions of the fin layer 22 and the substrate 15 to form openings, or deep trenches 40.

Method 200 may continue with forming a capacitor within the deep trench (block 208). For example, the deep trench 40 may be filled with conductive polysilicon forming capacitor 50. The polysilicon filling trenches 40 may be formed to a height where the upper surface 51 of capacitor 50 is coplanar with the upper surface 14 of buried dielectric layer 13 or may be formed to a height where the upper surface 51 of capacitor 50 is below the upper surface 14 of buried dielectric layer 13.

Method 200 may continue with forming sacrificial strap material upon the capacitor within the deep trench (block 210). For example, sacrificial strap material 70 may be deposited upon capacitor 50 upper surface 51 within trench 40. The sacrificial strap material 70 makes a connection to the capacitor 50 and to the fin layer 20. The sacrificial strap material 70 may be removed in subsequent fabrication processes and therefore may be a material that may allow for selective removal relative to other structure 100 materials. The sacrificial strap material 70 may be formed to a thickness such that upper surface 71 is coplanar with an upper surface 21 of fin layer 20. Alternatively, the sacrificial strap material 70 may be formed to a thickness such that upper surface 71 is below the upper surface 21 of fin layer 20. In some embodiments, a spacer 60 may be formed upon the capacitor 50 about the perimeter of the capacitor 50 and upon the sidewalls 41 of the trench 40 prior to forming the sacrificial strap material 70 upon the capacitor 50.

Method 200 may continue with forming a finFET fin and sacrificial strap by removing portions of the fin layer and portions of the sacrificial strap material 70, respectively, the sacrificial strap being aligned with the fin (block 212). For example, fin 80 may be formed by utilizing a to protect a masked portions of structure 100 within the desired fin footprints from an etchant utilized to remove non-masked portions of structure 100 outside of the desired fin footprints. The mask can be formed using process steps such as, without limitation: material deposition or formation; photolithography; imaging; etching; and cleaning. For instance, a soft mask or a hard mask can be formed overlying the protected portions to serve as the mask while non-masked material is removed by the etchant. The etchant(s) may be chosen to selectively remove the material of fin layer 20 stopping at the buried dielectric layer 13 and to remove a portion of sacrificial strap material 70 stopping at capacitor 50. The retained fin layer 20 material forms fins 80 and the retained sacrificial strap material 70 forms sacrificial strap 70'. Multiple etching stages may be utilized to initially form fins 80 and subsequently form sacrificial strap 70', or visa versa. The fin 80 and the sacrificial strap 70' are aligned in that sidewalls 82 of the fin 80 are coplanar with sidewalls 72 of sacrificial strap 70'.

Method 200 may continue with forming a gate upon the substrate and upon the fin (block 214). For example, gate 90 can be formed using subtractive etching processes subsequent to e.g., forming a gate dielectric layer 92 upon the substrate, gate material 94 layer upon the gate dielectric layer 92, and gate cap layer 98 upon the gate material 94 layer. In certain embodiments the gate cap 98 may be utilized as a etch mask (e.g. hard mask, etc.) associated with the formation of gates 90. Using the cap 98 as a mask, an etchant may be used to remove unprotected portions of the gate material 94 and gate dielectric 92 outside the footprint of gates 90, thereby defining the gates 90. The fin 80 and gate 90 may take the form of an finFET, such that a portion of fin 80 underlying the gate 90 may be the channel region of the finFET and the portions of fin 80 extending from either side of gate 90 may be the source and drain regions of the finFET.

Method 200 may continue with removing the sacrificial strap exposing an upper surface of the capacitor (block 216). For example, sacrificial gate 70' may be removed using any suitable etching technique such as dry etch, wet etch, or combination of both. For example, sacrificial strap 70' can be removed using utilizing an etchant, such as hydrochloric acid, etc. In certain implementations, the etching technique may require a etch mask to be formed that resists etching to protect portions of semiconductor device 10. Following the formation of the etch mask, the sacrificial strap 70' may remove by the etchant.

Method 200 may continue with forming a replacement strap by merging epitaxially grown material respectively grown from the fin sidewalls and grown the capacitor, the replacement strap physically contacting the fin 80 and the capacitor 50 (block 218). For example, epitaxially grown material 130 is grown from fin 80 sidewalls 82 and upper surface 81 and is grown from upper surface 51 of capacitor 50. Epitaxially grown material 130 grows faster from capacitor 50 relative to growth from fin 80, resulting in a thicker or more epitaxially grown material 130 above the capacitor 50 than above the fin 80. During epitaxial material 130 growth, the epitaxial material 130 grown from fins 80 merges with the epitaxial material 130 grown from capacitor 50. As a result, strap 150 is formed by the merged epitaxially grown material 130 grown from fin 80 and grown from capacitor 150. The epitaxial growth of material 130 from capacitor 50 begins at a relatively lower seed surface 51, allowing an adequate time to appropriately form epitaxial material 130 from fins 80, while also minimizing the likelihood of epitaxial material 130 overgrowth that may physically contact, and thereby short, adjacent capacitors 50. Method 200 ends at block 220.

Figure 11:
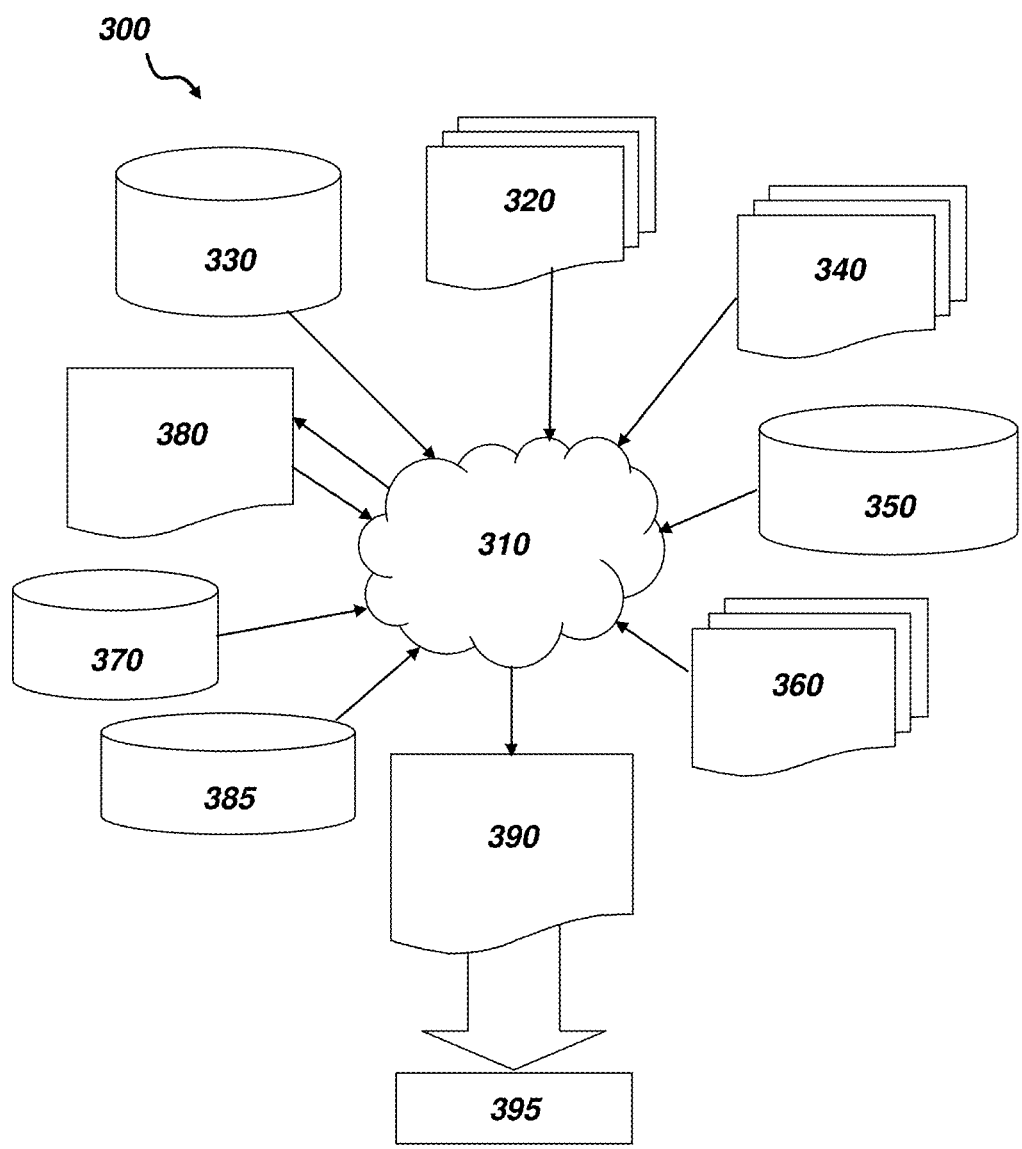
FIG. 11 depicts a flow diagram of a design process used in semiconductor design, manufacture, and/or test, in accordance with various embodiments of the present invention.

Referring now to FIG. 11, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIG. 1A-FIG. 9B.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIG. 1A-FIG. 9B. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIG. 1A-FIG. 9B to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 14, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1A-FIG. 9B. In one embodiment, design structure 390 may comprise a compiled, executable HDL simulation model that functionally simulates the devices shown in FIG. 1A-FIG. 9B.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1A-FIG. 13C. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

Unless described otherwise or in addition to that described herein, "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly" or "poly silicon" should be understood to refer to polycrystalline silicon.

References herein to terms such as "vertical", "horizontal", etc. are made by way of example, and not by way of limitation, to establish a frame of reference. The term "horizontal" as used herein is defined as a plane parallel to the conventional plane or surface of the substrate 15, regardless of the actual spatial orientation of the semiconductor substrate 15. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device fabrication process comprising:
    forming a fin layer upon a semiconductor substrate;
    forming a deep trench within the fin layer and within the substrate;
    forming a capacitor within the deep trench;
    forming sacrificial strap material upon the capacitor within the deep trench;
    forming a fin by removing portions of the fin layer;
    forming a sacrificial strap by removing portions of the sacrificial strap material, the sacrificial strap contacting the fin and contacting the capacitor;
    removing the sacrificial strap, and;
    forming a replacement strap by merging material epitaxially grown from the fins and from the capacitor.

2. The semiconductor device fabrication process of claim 1, wherein the capacitor upper surface is below the substrate upper surface.

3. The semiconductor device fabrication process of claim 1, wherein the capacitor is polysilicon material formed within the deep trench.

4. The semiconductor device fabrication process of claim 1, wherein the sacrificial strap material is poly silicon germanium.

5. The semiconductor device fabrication process of claim 1, wherein sidewalls and upper surface of the sacrificial strap are coplanar with sidewalls and upper surface of the fin, respectively.

6. The semiconductor device fabrication process of claim 1, further comprising:
    forming a gate upon the substrate and upon the fin.

7. The semiconductor device fabrication process of claim 6, further comprising:
    forming gate spacers upon sidewalls of the gate.

8. The semiconductor fabrication process of claim 1, further comprising:

forming an inner spacer upon the capacitor perimeter and upon sidewalls of the deep trench.

9. The semiconductor device fabrication process of claim 8, wherein the inner spacer covers the substrate within the deep trench to limit epitaxial growth of material from the capacitor and from the fin.

10. The semiconductor device fabrication process of claim 1, wherein the sacrificial strap upper surface is coplanar with the fin layer upper surface.

11. The semiconductor device fabrication process of claim 1, wherein forming the replacement strap further comprises:
   epitaxially growing material from the fin sidewalls and the fin upper surface, and;
   epitaxially growing material from the capacitor upper surface.

12. The semiconductor device fabrication process of claim 11, wherein the epitaxy material grown from the capacitor upper surface is formed at a faster rate relative to the epitaxy material grown from the fin sidewalls and the fin upper surface.

13. The semiconductor device fabrication process of claim 11, wherein the epitaxially grown material from the capacitor upper surface is thicker relative to the epitaxially grown material from the fin upper surface.

14. An embedded dynamic random access memory (eDRAM) semiconductor device fabrication process comprising:
   forming a fin layer upon a semiconductor substrate;
   forming a plurality of deep trenches within the fin layer and within the substrate;
   forming a plurality of capacitors within the plurality of deep trench;
   forming sacrificial strap material upon the plurality of capacitors;
   forming a plurality of fins by removing portions of the fin layer;
   forming a plurality of sacrificial straps by removing portions of the sacrificial strap material, each respective sacrificial strap contacting a fin and contacting a capacitor;
   forming a plurality of gates upon the substrate and upon the plurality of fins;
   removing the plurality of sacrificial straps, and;
   forming a replacement strap by merging material epitaxially grown from the plurality of fins and from the plurality of capacitors, wherein material is epitaxially grown from the upper surface of each of the plurality of capacitors and wherein the upper surfaces of each of the plurality of capacitors are lower relative to epitaxially growth seed surfaces of the plurality of fins.

* * * * *